(12) United States Patent
Romero et al.

(10) Patent No.: US 11,073,577 B2
(45) Date of Patent: Jul. 27, 2021

(54) TMR MAGNETIC SENSOR

(71) Applicant: Allegro MicroSystems, LLC, Manchester, NH (US)

(72) Inventors: Hernán D. Romero, Buenos Aires (AR); Octavio H. Alpago, Buenos Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 183 days.

(21) Appl. No.: 16/533,030

(22) Filed: Aug. 6, 2019

(65) Prior Publication Data
US 2021/0041511 A1  Feb. 11, 2021

(51) Int. Cl.
*G01R 33/09* (2006.01)
(52) U.S. Cl.
CPC .................................. *G01R 33/098* (2013.01)
(58) Field of Classification Search
CPC .................................................... G01R 33/098
See application file for complete search history.

(56) References Cited

U.S. PATENT DOCUMENTS

| | | | |
|---|---|---|---|
| 9,605,975 B2 | 3/2017 | Foletto et al. | |
| 9,810,519 B2 | 11/2017 | Taylor et al. | |
| 10,254,103 B2 | 4/2019 | Taylor et al. | |
| 10,746,820 B2* | 8/2020 | Lassalle-Balier | G01R 33/025 |
| 10,917,092 B2* | 2/2021 | Romero | H03K 17/97 |
| 2007/0114992 A1* | 5/2007 | Muniraju | G01R 15/207 |
| | | | 324/225 |

OTHER PUBLICATIONS

Pong et al., "Enhancement of Tunneling Magnetoresistance by Optimization of Capping Layer Thickness in CoFeB/MgO/CoFeB Magnetic Tunnel Junctions;" Journal of Applied Physics, vol. 105, No. 7; Apr. 2009; 3 Pages.
J. Mathon, "Theory of Tunneling Magnetoresistance;" *Phase Transitions*, vol. 76, Nos. 4-5; Jan. 2003; pp. 491-500; 11 Pages.

* cited by examiner

*Primary Examiner* — Reena Aurora
(74) *Attorney, Agent, or Firm* — Daly, Crowley, Mofford & Durkee, LLP

(57) ABSTRACT

Methods and apparatus for a TMR-based sensor having a first magnetic field sensing element comprising a bridge having first, second, third, and fourth legs. Legs of the bridge comprise TMR elements with pillars connected to one or more switch matrixes to adjust total resistances of the bridge legs. Equalizing the resistance of the bridge legs can enhance sensor performance.

26 Claims, 12 Drawing Sheets

TMR MAGNETIC SENSOR

BACKGROUND

As is known in the art, magnetic field sensors are often used to detect a ferromagnetic target. They often act as sensors to detect motion or position of the target. Such sensors are ubiquitous in many areas of technology including robotics, automotive, manufacturing, etc. For example, a magnetic field sensor may be used to detect when a vehicle's wheel locks up, triggering the vehicle's control processor to engage the anti-lock braking system. In this example, the magnetic field sensor may detect rotation of the wheel. Magnetic field sensors may also detect distance between the magnetic field sensor and an object. Sensors such as these may be used to detect the proximity of the object as it moves toward and away from the magnetic field sensor. Conventional magnetic field sensors typically include circular or square coils.

Conventional tunneling magnetoresistive (TMR)-based sensors use TMR elements arranged in a bridge configuration. TMR elements may suffer from large resistance variations because of the variability the isolation layer (typically MgO) thickness. Therefore, TMR-based bridge arrangements can suffer from large offsets, which severely limits the PSRR capability of the sensor.

SUMMARY

Embodiments of the invention provide methods and apparatus for a sensor including a bridge with legs each comprising a resistor formed from TMR pillars. In embodiments, one or more switches can be coupled to one or more pillars in one or more of the bridge resistors for adjusting the total resistance of one or more of the respective legs to equalize the resistance in each of the legs. By equalizing the bridge resistances, sensor performance can be enhanced. For example, the effects of power supply rejection ratio (PSRR) can be reduced by equalizing the resistance of the bridge legs.

In one aspect, a sensor comprises: a first magnetic field sensing element comprising a bridge having first, second, third, and fourth legs, wherein the first magnetic field sensing element is configured to provide a differential output signal, wherein the first leg of the bridge comprises a first set of pillars provided as tunneling magnetoresistance (TMR) elements, the second leg of the bridge comprises a second set of pillars provided as TMR elements, the third leg of the bridge comprises a third set of pillars provided as TMR elements, and, the fourth leg of the bridge comprises a fourth set of pillars provided as TMR elements, and a first switch matrix including a first switch coupled to a first one of the pillars in the first set of pillars to adjust a total resistance of the first leg of the bridge.

A sensor can further include one or more of the following features: the first switch includes a closed and an open position, a second switch matrix including a second switch coupled to a first one of the pillars in the second set of pillars to adjust a total resistance of the second leg of the bridge, the first and second switch matrices are configured to equalize respective resistance of the first and second sets of pillars, a second switch matrix including a second switch coupled to a first one of the pillars in the second set of pillars to adjust a total resistance of the second leg, a third switch matrix including a third switch coupled to a first one of the pillars in the third set of pillars to adjust a total resistance of the third leg, and a fourth switch matrix including a fourth switch coupled to a first one of the pillars in the fourth set of pillars to adjust a total resistance of the fourth leg, the first, second, third, and fourth switch matrixes are configured to equalize respective resistance of the first, second, third, and fourth legs of the bridge, each of the first, second, third, and fourth switch matrixes includes respective switches coupled to more than one pillar in the respective first, second, third, and fourth sets of pillars, at least two of the pillars in the first set of pillars that are coupled to switches in the first switch matrix are configured to have different resistances, and/or the first switch matrix provides a coarse and fine resistance adjustment for the first set of pillars using the different resistances.

In another aspect, a method comprises: employing a first magnetic field sensing element comprising a bridge having first, second, third, and fourth legs, wherein the first magnetic field sensing element is configured to provide a differential output signal, wherein the first leg of the bridge comprises a first set of pillars provided as tunneling magnetoresistance (TMR) elements, the second leg of the bridge comprises a second set of pillars provided as TMR elements, the third leg of the bridge comprises a third set of pillars provided as TMR elements, and, the fourth leg of the bridge comprises a fourth set of pillars provided as TMR elements, and coupling a first switch matrix, which includes a first switch coupled to a first one of the pillars in the first set of pillars, to adjust a total resistance of the first leg of the bridge.

A method can further include one or more of the following features: the first switch includes a closed and an open position, employing a second switch matrix including a second switch coupled to a first one of the pillars in the second set of pillars to adjust a total resistance of the second leg of the bridge, the first and second switch matrices are configured to equalize respective resistance of the first and second sets of pillars, employing a second switch matrix including a second switch coupled to a first one of the pillars in the second set of pillars to adjust a total resistance of the second leg, a third switch matrix including a third switch coupled to a first one of the pillars in the third set of pillars to adjust a total resistance of the third leg, and a fourth switch matrix including a fourth switch coupled to a first one of the pillars in the fourth set of pillars to adjust a total resistance of the fourth leg, the first, second, third, and fourth switch matrixes are configured to equalize respective resistance of the first, second, third, and fourth legs of the bridge, each of the first, second, third, and fourth switch matrixes includes respective switches coupled to more than one pillar in the respective first, second, third, and fourth sets of pillars, at least two of the pillars in the first set of pillars that are coupled to switches in the first switch matrix are configured to have different resistances, and/or the first switch matrix provides a coarse and fine resistance adjustment for the first set of pillars using the different resistances.

In a further aspect, a sensor comprises: a first magnetic field sensing element means for sensing magnetic fields comprising a bridge having first, second, third, and fourth legs, wherein the first leg of the bridge comprises a first set of pillars provided as tunneling magnetoresistance (TMR) elements, the second leg of the bridge comprises a second set of pillars provided as TMR elements, the third leg of the bridge comprises a third set of pillars provided as TMR elements, and, the fourth leg of the bridge comprises a fourth set of pillars provided as TMR elements, and a first switch matrix means for adjusting a total resistance of the first leg of the bridge.

A sensor can further include one or more of the following features: a second switch matrix means including a second switch coupled to a first one of the pillars in the second set of pillars for adjusting a total resistance of the second leg of the bridge, the first and second switch matrix means are configured for equalizing respective resistance of the first and second sets of pillars, a second switch matrix means including a second switch coupled to a first one of the pillars in the second set of pillars to adjust a total resistance of the second leg, a third switch matrix means including a third switch coupled to a first one of the pillars in the third set of pillars to adjust a total resistance of the third leg, and a fourth switch matrix means including a fourth switch coupled to a first one of the pillars in the fourth set of pillars to adjust a total resistance of the fourth leg, the first, second, third, and fourth switch matrix means are configured for equalizing respective resistance of the first, second, third, and fourth legs of the bridge, each of the first, second, third, and fourth switch matrix means includes respective switches coupled to more than one pillar in the respective first, second, third, and fourth sets of pillars, at least two of the pillars in the first set of pillars that are coupled to switches in the first switch matrix means are configured to have different resistances, and/or the first switch matrix means provides a coarse and fine resistance adjustment for the first set of pillars using the different resistances.

BRIEF DESCRIPTION OF THE DRAWINGS

The foregoing features of this invention, as well as the invention itself, may be more fully understood from the following description of the drawings in which.

DETAILED DESCRIPTION

Figure 1:
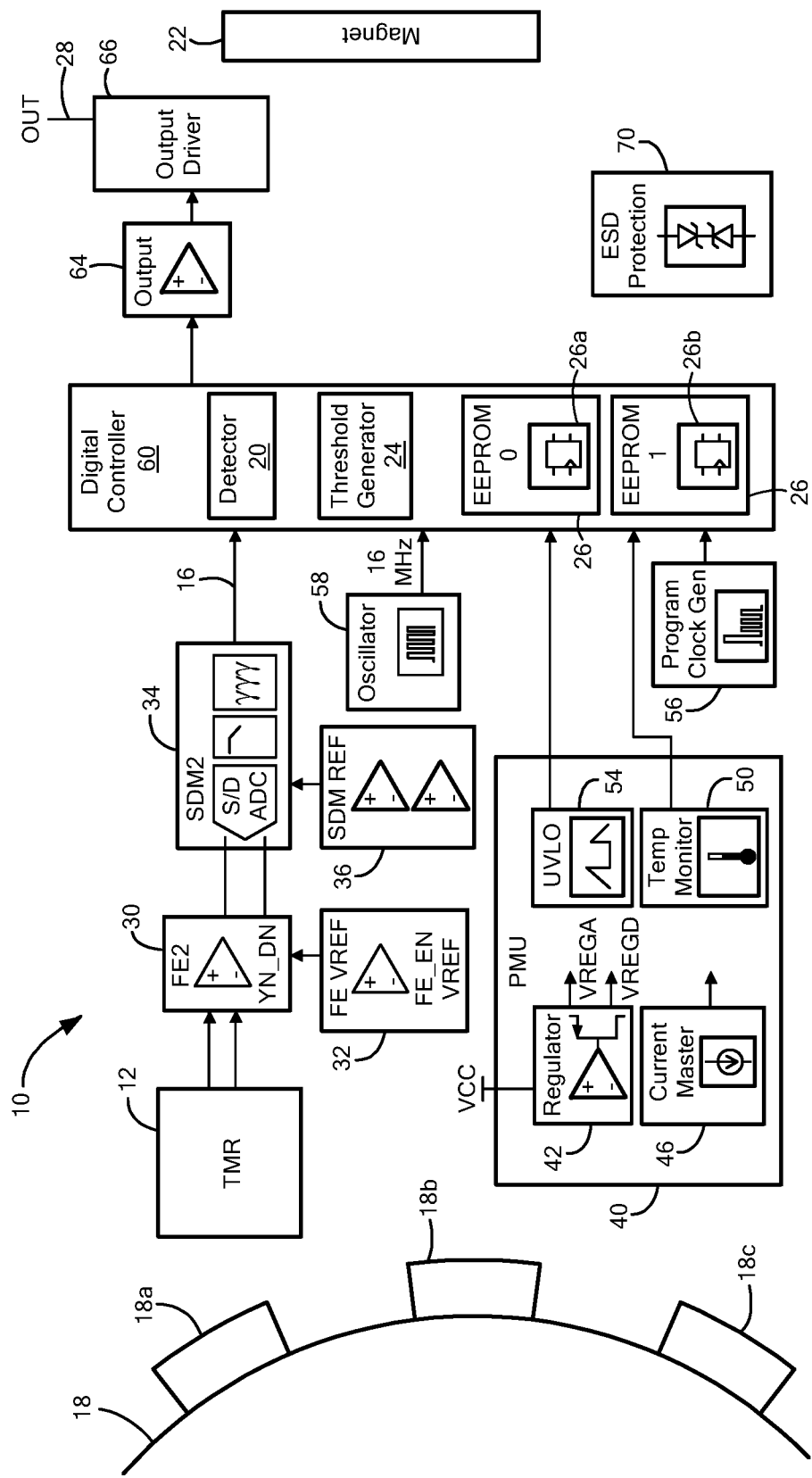
FIG. 1 is a schematic representation of an example sensor having a TMR bridge with resistance equalization.

FIG. 1 shows an example magnetic field sensor 10 having at least one magnetic field sensing element 12 that includes one or more TMR elements configured to improve sensor performance as compared with conventional sensors. The sensor 10 is configured to generate a magnetic field signal 16 indicative of a magnetic field associated with a target 18 and a detector 20 responsive to the magnetic field signal and to a threshold level from a threshold generator 24 to generate a sensor output signal 28 containing transitions associated with features of the target in response to the magnetic field signal crossing the threshold level.

The target 18 can have a variety of forms, including, but not limited to a gear having gear teeth 18a-18c or a ring magnet having one or more pole pair. Also, linear arrangements of ferromagnetic objects that move linearly are possible. In the example embedment of FIG. 1, magnetic field sensor 10 may take the form of a rotation detector to detect passing gear teeth, for example, gear teeth 18a-18c of a ferromagnetic gear or, more generally target object 18. A permanent magnet 22 can be placed at a variety of positions proximate to the gear 18, resulting in fluctuations of a magnetic field proximate to the gear as the gear rotates in a so-called "back-bias" arrangement.

Features of the target 18 are spaced from the sensing elements 12 by an airgap. Although intended to be fixed once the sensor 10 is in place in a particular application, the airgap can vary for a variety of reasons. A difference between angles of the transitions of the sensor output signal 28 and locations of the associated features 18a-18c of the target 28 is referred to as a "hard offset."

Sensing elements 12 can take a variety of forms, such as TMR elements, as may be arranged in one or more bridge or other configurations in order to generate one or more single-ended or differential signals indicative of the sensed magnetic field. A front-end amplifier 30 can be used to process the magnetic field sensing element output signal to generate a further signal for coupling to an analog-to-digital converter (ADC) 34 as may include one or more filters, such as a low pass filter and/or notch filter, and as may take the form of a sigma delta modulator to generate a digital magnetic field signal 16. Features of the magnetic field signal processing can include a front-end reference 32 and a sigma delta reference 36.

Sensor 10 includes a power management unit (PMU) 40 as may contain various circuitry to perform power management functions. For example, a regulator 42 can output a regulated voltage for powering analog circuitry of the sensor (VREGA) and/or a regulated voltage for powering digital circuitry of the sensor (VREGD). A bias current source 46, a temperature monitor 50 and an undervoltage lockout 54 can monitor current, temperature, and voltage levels and provide associated status signals to a digital controller 60. A clock generation element 56 and an oscillator 58 are coupled to the digital controller 60.

Digital controller 60 processes the magnetic field signal 16 to determine the speed, position, and/or direction of movement, such as rotation of target 18 and outputs one or more digital signals to an output protocol module 64. More particularly, controller 60 determines the speed, position, and/or direction of target 18 based on the magnetic field signal 16 and can combine this information with fault information in some embodiments to generate the sensor output signal 28 in various formats. The output of module 64 is fed to an output driver 66 that provides the sensor output signal 28 in various formats, such as a so-called two-wire format in which the output signal is provided in the form of current pulses on the power connection to the sensor or a three-wire format in which the output signal is provided at a separate dedicated output connection. Formats of the output signal 28 can include variety of formats, for example a pulse-width modulated (PWM) signal format, a Single Edge Nibble Transmission (SENT) format, a Serial Peripheral Interface (SPI) format, a Local Interconnect Network (LIN) format, a CAN (Controller Area Network) format, an Inter-Integrated Circuit (I²C) format, or other similar signal formats. Sensor 10 can further include electrostatic discharge (ESD) protection 70.

The digital controller 60 includes detector 20, threshold generator 24, and memory 26 such as EEPROMs 26a, 26b. Memory 26 can be used to store values for various sensor functionality including storing function coefficients for use by the threshold generator 24 in generating the adaptive threshold levels for use by detector 20.

Detector 20 is coupled to receive the threshold level thus generated and the magnetic field signal 16 and compare the received levels to generate a binary, two-state, detector output signal that has transitions when the signal 16 crosses the threshold level. Movement speed of the target 18 can be detected in accordance with the frequency of the binary signal.

It should be appreciated that a direction of rotation of the target 28 may be determined in embodiments containing multiple sensing elements 12 configured to generate phase separated magnetic field signals (as are sometimes referred to as channel signals), in which case the direction of rotation can be determined based on a relative phase or relative time difference (e.g., lag or lead) of a particular edge transition of detector output signals associated with the phase separated magnetic field signals.

It is understood that embodiments of TMR-based sensing elements are useful in a wide variety of magnetic sensors. While an example sensor is shown and described above, any practical magnetic sensor in which TMR sensing elements are desirable can be provided. For example, TMR sensing elements are useful in many magnetic position and angle sensors that require high resolution. Further example sensors in which TMR-based sensing elements are shown and described below.

Figure 2:
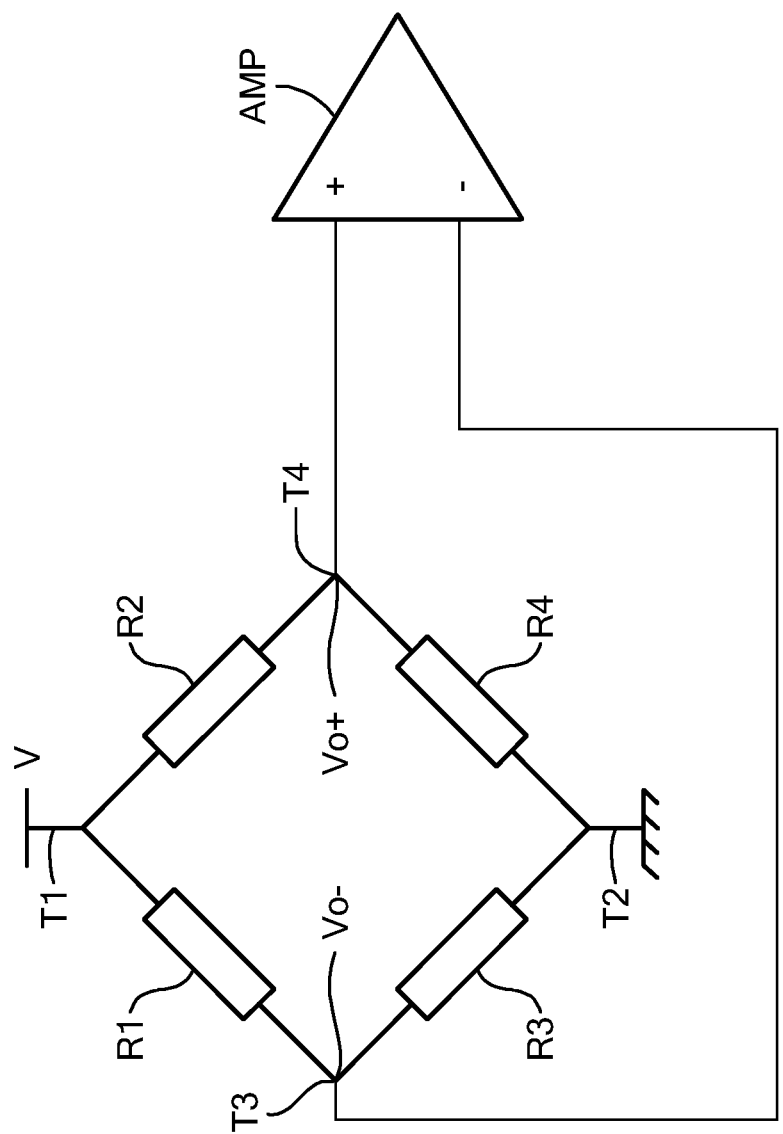
FIG. 2 is schematic representation of a TMR bridge having legs with adjustable resistances.

FIG. 2 shows an example TMR bridge 200 having a first resistor R1, a second resistor R2, a third resistor R3, and fourth resistor R4 coupled in a bridge configuration, which can correspond to the sensing elements 12 of FIG. 1. A first terminal T1 is coupled to a voltage supply and a second terminal T2 is coupled to ground (or other potential). A third terminal T3 provides a first differential output signal Vo− and a fourth terminal T4 provides a second differential output signal Vo+. The differential output Vo+, Vo− of the bridge can be provided to an amplifier AMP or other circuitry for processing of the output of the magnetic field sensing elements, such as described above.

Figure 3A:
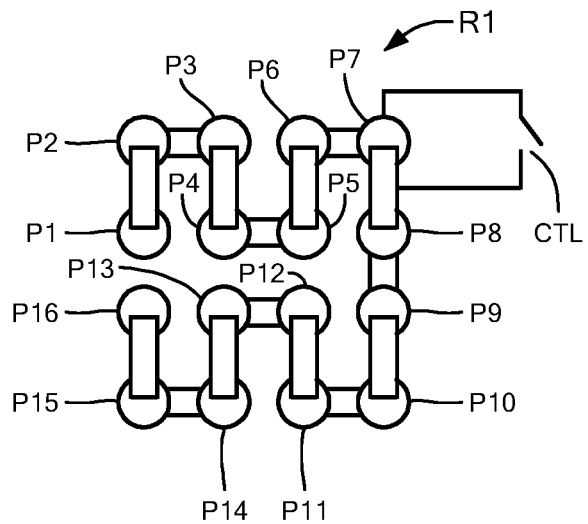
FIG. 3A is a schematic representation of an adjustable bridge resistor having TMR pillars.

FIG. 3A shows an example implementation in which bridge resistor R1 contains sixteen pillars P1-16 that provide the total resistance for R1. In the illustrated embodiment, pillar P7 is connected to a switch SW, which is controlled by a control signal CTL. When the switch SW is closed, the pillar P7 is shorted out, thus reducing the overall resistance of the bridge resistor R1 since the resistance of pillar P7 does not contribute to the overall resistance of R1.

Figure 3B:
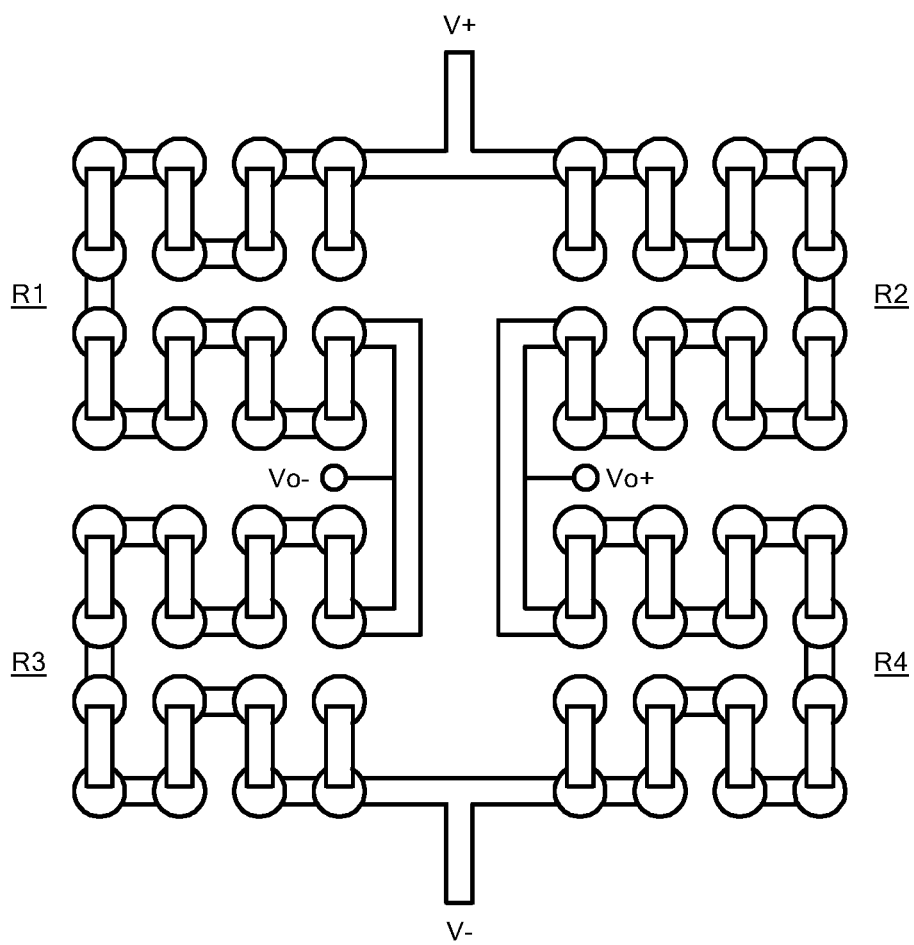
FIG. 3B is a schematic representation of a bridge having resistors provided by TMR pillars.
Figure 3C:
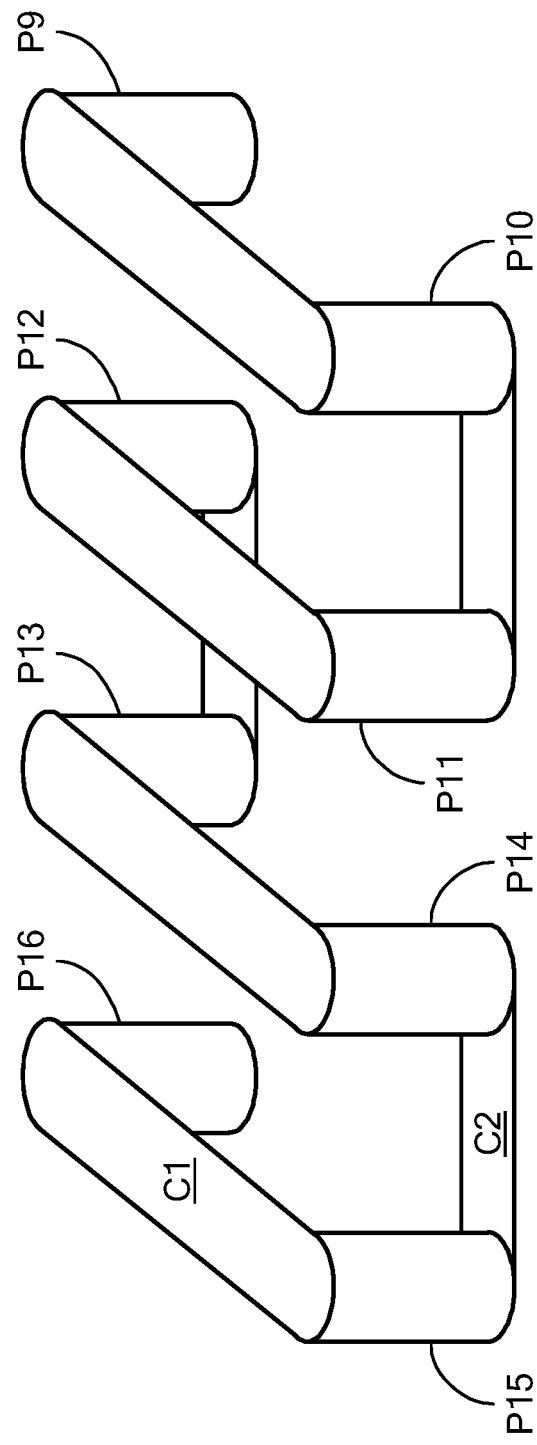
FIG. 3C is a perspective view of a portion of the TMR bridge of FIG. 3A.

FIG. 3B shows an example implementation in which each of the bridge resistors R1, R2, R3, R4 comprises a series of pillars formed from TMR elements. As explained more fully below, by controlling switches coupled to the pillars, e.g., the individual TMR elements, the resistance of each of the bridge resistors R1, R2, R3, R4 can be modified to balance the respective resistances. That is, in embodiments, the resistance of the bridge resistors R1, R2, R3, R4 should be as close to equal as possible. FIG. 3C shows a perspective view of FIG. 3A in which pillars P9-P16 are alternately coupled together at the top and bottom. As can be seen, pillars P15 and P16 are connected at the top by connector C1 and pillars P14 and P15 connected at the bottom by connector C2.

It is understood that a switch can be coupled to one or more pillars in any way to modify the overall resistance of the bridge resistor. As described above, a switch can have an open or closed position to selectively remove the resistance of a pillar by short circuiting the pillar. In other embodiments, a switch can couple a signal, such as a voltage supply signal, ground signal, output signal, etc., to a node adjacent a pillar or between pillars to increase or decrease a total resistance of a bridge resistor, as shown and described more fully below.

It is understood that a TMR resistor that provides a leg of the bridge can comprise any practical number of pillars connected in series and/or in parallel to provide the TMR bridge resistor. As described more fully below, pillars can be designed to have the same or different resistances.

It should be noted that, assuming the bridge is driven by a constant voltage, changing the number of pillars changes the voltage drop across each active pillar. This may result in an overall sensitivity change if the voltage drop goes higher than say about 50 mv per pillar. On the other hand, if the change on the voltage drop across each pillar after having shorted one or more of them is such that the drop does not exceed about 50 mv, the sensitivity may not change. It will be appreciated that TMR pillars have the property of having a relatively constant sensitivity between about +/−50 mv of voltage drop across them. Higher voltage drops may create a reduction in sensitivity. Another approach to avoid these issues is to drive the bridge with constant current such that the voltage drop across each pillar is independent of the number of active pillars.

Figure 4:
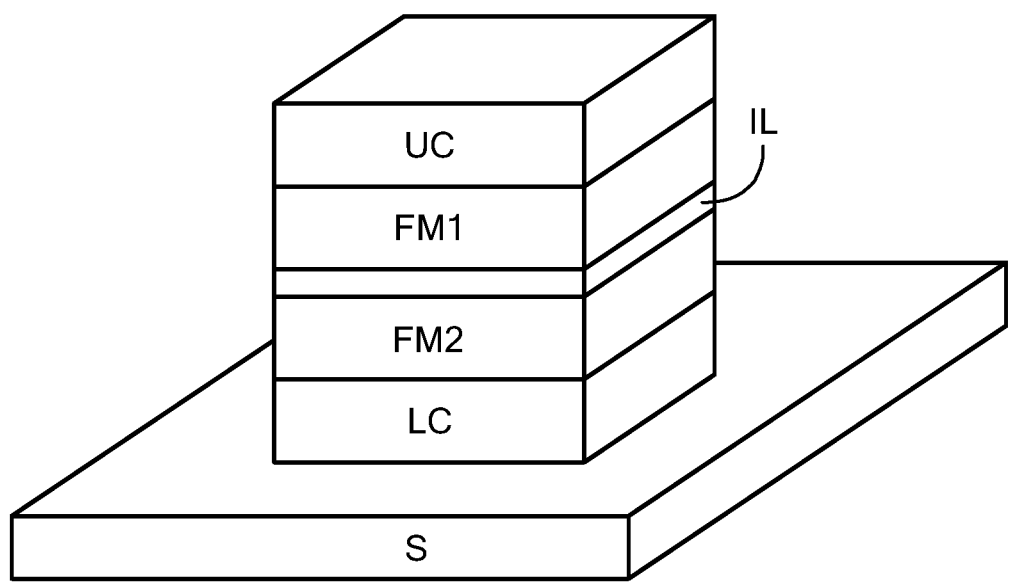
FIG. 4 is a schematic representation of a MTJ with tunneling magnetoresistance.

FIG. 4 shows an example magnetic tunnel junction (MTJ) that uses TMR to provide TMR elements, e.g., pillars. As is known in the art, tunneling magnetoresistance (TMR) occurs in a magnetic tunnel junction (MTJ) which has first and second ferromagnets FM1, FM2 separated by a thin insulative layer IL, such as MgO. An upper contact UC can be provided on the first ferromagnet FM1 and a lower contact LC can be provided on the second ferromagnet FM2. A substrate S can support the MTJ structure. The insulative layer should be thin, in the order of a few nanometers, so as to allow electrons to 'tunnel' from one of the ferromagnets to the other. It will be appreciated that this is a quantum mechanical phenomenon.

The direction of the two magnetizations of the ferromagnetic films FM1, FM2 can be switched individually by an external magnetic field. If the magnetizations are in a parallel orientation it is more likely that electrons will tunnel through the insulating film IL than if they are in the oppositional (antiparallel) orientation. Consequently, such a junction can be switched between two states of electrical resistance, one with low resistance and one with high resistance.

It is understood that the directions of FM1 and FM2 do not necessarily have to be switched: if the external field angle is neither parallel or anti-parallel then the resulting magnetization changes as the composite angle between the external field and the reference layer. The resistance variation is proportional to the cosine of such composite angle which makes TMR elements useful for angle sensing applications.

Electrons with certain spin orientation ("spin-up" or "spin-down") can tunnel from one ferromagnetic layer to another ferromagnetic layer through the non-conductive thin insulating layer if there are available free states with the same spin orientation. In case of the parallel state, the majority spin ("spin-up") electrons and minority spin ("spin-down") electrons can tunnel to the second ferromagnetic layer and fill majority ("up") and minority ("down") states, respectively. This will result in large conductance and corresponds to the low resistive state. In case of the anti-parallel state, the majority spin ("spin-down") electrons and minority spin ("spin-up") electrons from first ferromagnetic layer fill the minority ("down") and majority ("up") states in the second ferromagnetic layer, respectively. This will result in the low conductance and corresponds to the high resistive state. Tunneling magnetoresistance is described in J. Mathon, *Theory of Tunneling Magnetoresistance*, 76 PHASE TRANSITIONS 491-500 (2003), which is incorporated herein by reference.

TMR elements may suffer from large resistance variations because of the variability of the isolation layer IL thickness. TMR pillars can have large resistance variations without any applied field, known as "base resistance," due to the variability of the isolation layer IL thickness. Conventional TMR-based bridge arrangements may suffer from large offsets, which can limit the PSRR capability of the sensor. Since resistances of the TMR pillars that form the bridge resistors can vary, the overall resistance of the bridge resistors can vary. While such resistance variations can average over the number of pillars, the overall resistance of an individual bridge leg can vary from leg to leg. It will be appreciated that the more pillars, the smaller the relative unbalance. However, for some practical number of pillars (e.g., about 20 to 40) unbalances can be as large as 10-20%. This variability in resistances in legs of TMR-based bridges can cause relatively large offsets, which may limit sensor performance due to low power supply rejection ratio (PSRR). PSRR refers to the ability of a circuit to suppress power supply variations in an output signal. For example, TMR bridge legs can be as unbalanced as 10%, which may be a significant factor for PSRR. The larger the resistance offsets in the TMR bridge, the larger the noise coming from the supply that is converted to differential so that noise can dominate the sensor output.

It is understood that the conversion to differential occurs as a consequence of the supply voltage variations being propagated through the bridge in a non-symmetrical way. Thus, the percentage unbalance of the bridge will dictate the amount of supply voltage variation that will be converted into a differential signal. For example, for a 10% unbalanced bridge, then 10% of the total supply variation will be converted into differential signal This undesired signal can be undistinguishable from the useful sensed magnetic signal, thus introducing a large error into the system.

Figure 5:
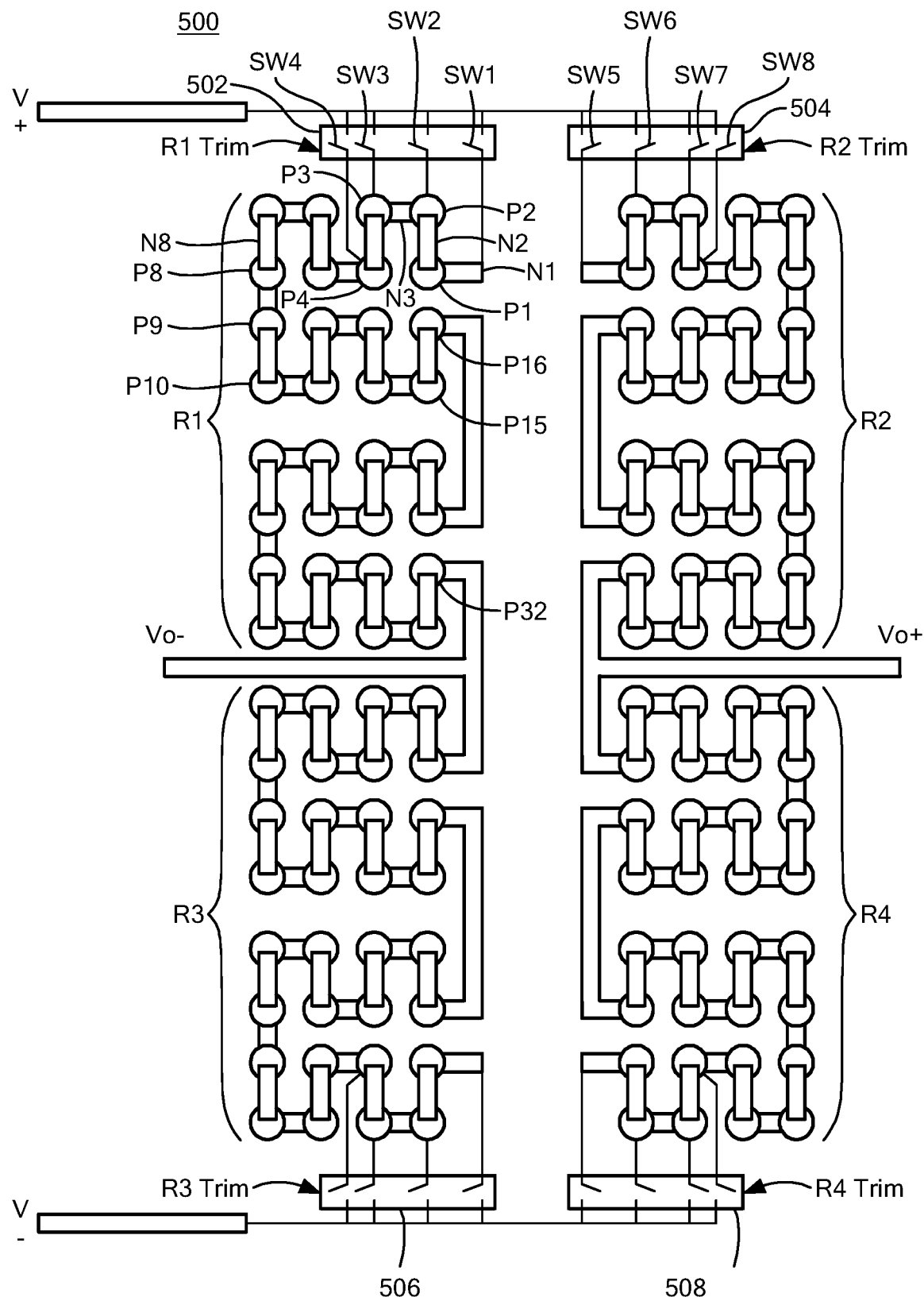
FIG. 5 is a schematic representation of a bridge having a switching matrix to select a total resistance of a bridge TMR resistor.

FIG. 5 shows a TMR bridge 500 having an example pillar switching scheme. By selecting the appropriate switches for pillars in each bridge resistor, the overall resistance of each bridge resistor can be selected such that the differential output voltage Vo+-Vo- is as close as possible to zero without any applied magnetic field. This can significantly improve PSRR performance of the TMR transducer as compared to sensors having conventional TMR-based sensing elements.

The bridge 500 has resistors R1, R2, R3, R4 with a voltage supply V+ coupled to the R1/R2 node and ground, e.g., V-, coupled to the R3/R4 node. The differential output voltage signals Vo-, Vo+ are provided at the R1/R3 and R2/R4 nodes. In the illustrated embodiment, bridge resistor R1 includes thirty-two pillars P1-32.

A first switch matrix 502 is coupled to a bridge supply voltage V+. The first switch matrix 502 includes a first switch SW1, a second switch SW2, a third switch SW3, and a fourth switch SW4. The first TMR resistor R1 includes pillars P1-P32 coupled in series with nodes N1-N32 connecting respective adjacent pillars. For example, the first node N1 is coupled to the first pillar P1 which is connected to the second pillar P2 by second node N2. The third node N3 connects the second pillar P2 the third pillar P3, and so on.

In the illustrated embodiment, the first switch SW1 has a first terminal coupled to V+ and a second terminal coupled to the first pillar P1. If only the first switch SW1 in the first switch matrix 502 is closed, then V+ is coupled to the first pillar P1 and the total resistance of R1 is the sum of the resistances of all the pillars, i.e., P1-P32. If only the second switch SW2 is closed, then V+ is coupled to the second pillar P2 so that the resistance of the first pillar P1 does not contribute to the resistance of R1. That is, the overall resistance of R1 with only the second switch SW2 closed is the sum of P2-P32. It will be appreciated that connecting the second switch SW2 to the top of P2 would cause the P2 resistance to contribute to R1 and connecting the second switch SW2 to the bottom of P2 would cause the P2 resistance to not contribute to the resistance of R1.

It is understood that having multiple switches closed will short circuit pillars so that the total resistance of the bridge resistor R1 is determined by which pillar is connected to V+.

In an example embodiment, the default setting for the switch matrix 502 is the third switch SW3 closed. In the illustrated embodiment, where there are four switches, the first or second switches SW1, SW2 can be closed to increase the resistance of R1. The fourth switch SW4 can be closed to decrease the total resistance of R1 by electrically removing pillars.

The bridge 500 can include a second switch matrix 504 for the second bridge resistor R2. Switches SW5-SW8 can be controlled to connect V+ to a given node to adjust the R2 resistance in a manner similar to that described above for the first switch matrix 502 coupled to resistor R1.

A third switch matrix 506 can be coupled between the third bridge resistor R3 and V-, e.g., ground. A fourth switch matrix 508 can be coupled between the fourth bridge resistor R4 and V-. The third switch matrix 506 can adjust a total resistance of the third resistor R3 and the fourth switch matrix 508 can adjust a total resistance of the fourth bridge resistor R4. By controlling switches in the first, second, third, and fourth switch matrices 502, 504, 506, 508, the respective resistances of the bridge resistors R1, R2, R3, R4 can be balanced/equalized to enhance sensor performance and PSRR, as described above.

Figure 6:
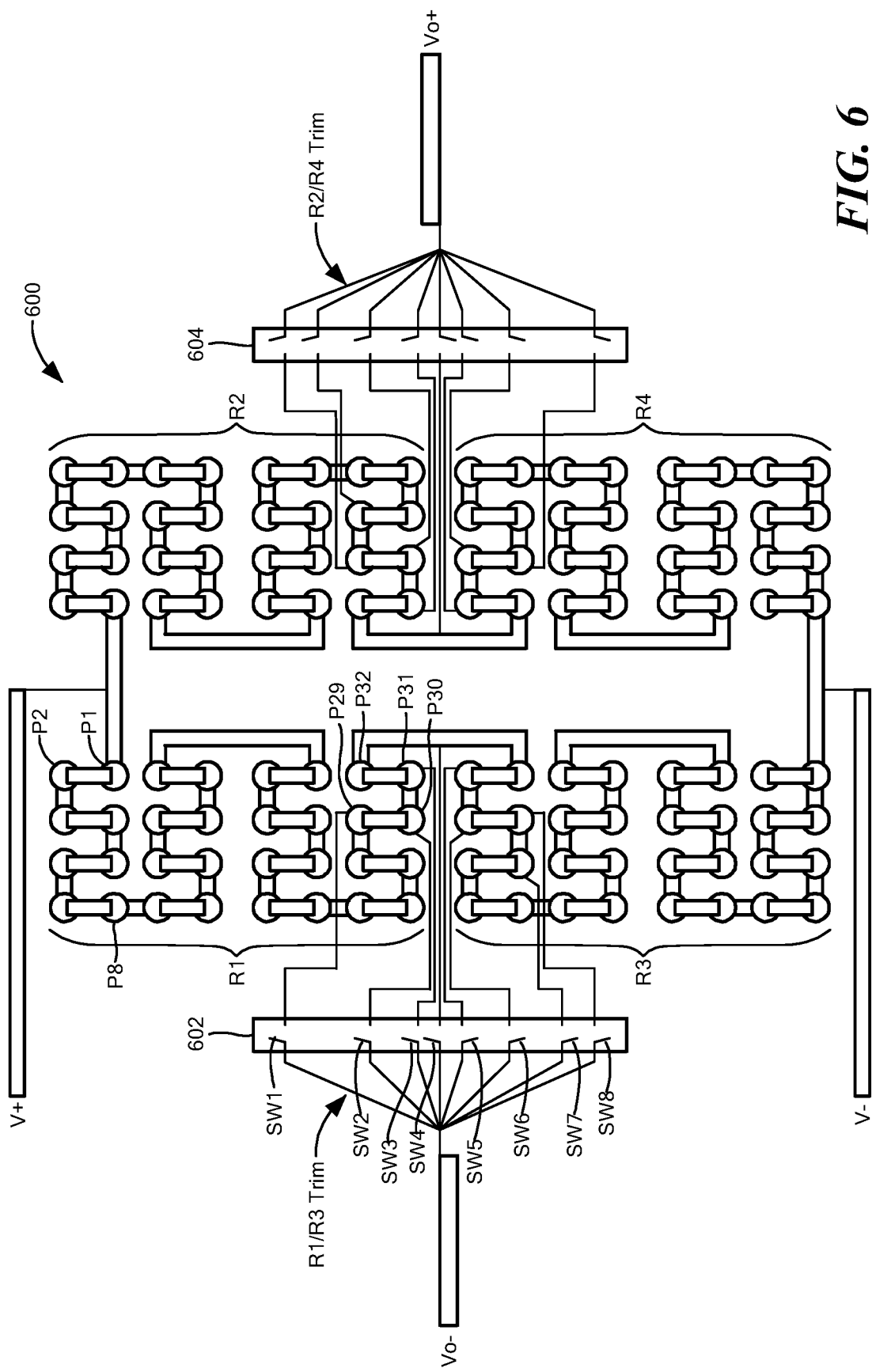
FIG. 6 is a schematic representation of a further bridge having a switching matrix to select a total resistance of a bridge TMR resistor.
Figure 7:
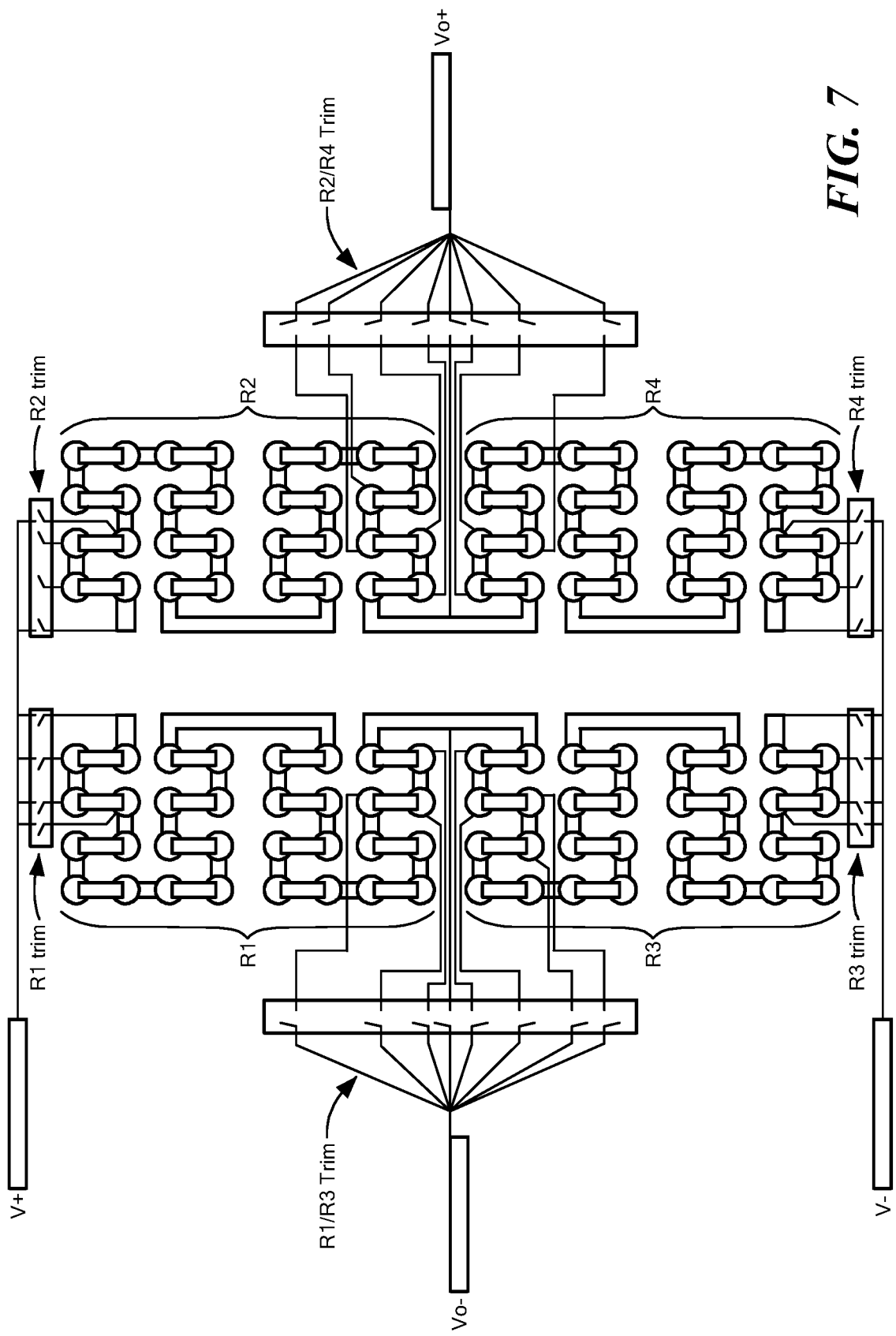
FIG. 7 is a schematic representation combing switching features of FIG. 5 and FIG. 6.

FIG. 6 shows an example bridge 600 having respective first and second switch matrixes 602, 604, coupled to the differential voltage outputs Vo-, Vo+ and to the bridge resistors R1, R2, R3, R4. The first switch matrix 602 includes a series of switches SW1-SW4 that couple the Vo-signal to a selected one of the connected R1 pillars P29-32 to provide a desired total resistance for R1. The first switch matrix 602 also includes switches SW5-SW8 that couple Vo- to a selected one of the R3 pillars to provide a desired total resistance for R3. In a similar manner, the second switch matrix 604 includes switches to select a total resistance for R2 and for R4. FIG. 7 shows a combination of the switching matrixes of FIG. 5 and FIG. 6.

By selecting the appropriate switches for each bridge resistor, the overall resistance of each individual TMR resistor can be selected such that Vo+-Vo- is as close as possible to zero without any applied magnetic field thereby improving the PSRR of the transducer. It is understood that resistance of the switches should minimize their contribution to the overall noise.

It is understood that any practical number of pillars can be used and any practical number of switches coupled to one or more pillars can be used to meet the needs of a particular application.

In embodiments, pillars can vary in resistance in a selected way. For example, some pillars for a particular bridge leg may have a larger resistance and other pillars, which may be coupled to a switch, may have a smaller resistance. In other embodiments, some switched pillars may have a larger resistance to provide a coarse adjustment in bridge leg overall resistance and some switched pillars may have a smaller resistance to provide a fine adjustment. It will be appreciated that the number of switched pillars can vary and that the resistance of the switched pillars can vary to meet the needs of a particular application.

In some embodiments, pairs of bridge legs can be balanced in overall resistance with pillar switching. In other embodiments, switched pillars may have mathematically related resistance values. For example, if four of ten pillars are switchable, the four pillars may have resistances that are logarithmically, exponentially, linear, non-linear, or otherwise related to meet the needs of a particular application.

Figure 8:
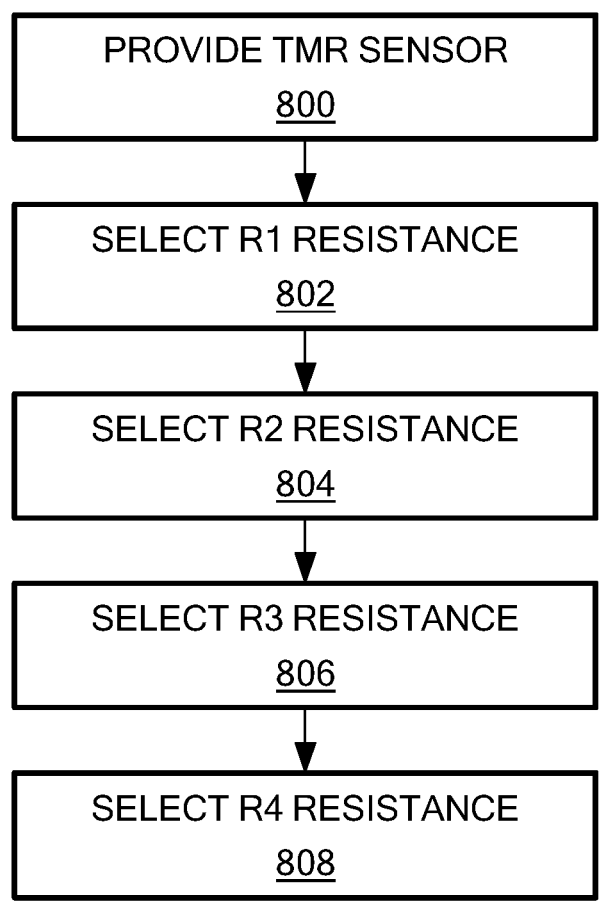
FIG. 8 is a flow diagram showing an example sequence of steps a bridge having switch matrixes to control the resistance of at least one bridge resistor.

FIG. 8 is a flow diagram having an example sequence of steps for balancing the resistance of TMR resistors in a bridge. In step 800, a sensor having a TMR bridge with a bridge resistor switch matrix is employed. In step 802, at least one switch in a first switch matrix is manipulated to select an overall resistance for a first bridge resistor R1. In step 804, at least one switch in a second switch matrix is manipulated to select an overall resistance for a second bridge resistor R2. In step 806, at least one switch in a third switch matrix is manipulated to select an overall resistance for a third bridge resistor R3. In step 808, at least one switch in a fourth switch matrix is manipulated to select an overall resistance for a fourth bridge resistor R4. As described above, the switch matrices controlling switches to equalize the resistance for each of bridge resistors to enhance sensor performance and reduce PSRR effects.

As noted above, adjusting the resistance of TMR sensing elements, such as bridge leg resistances, is desirable in a wide variety of magnetic sensor applications including sensors having linear outputs, digital and/or analog circuits, angle calculation, and position sensing.

Figure 9:
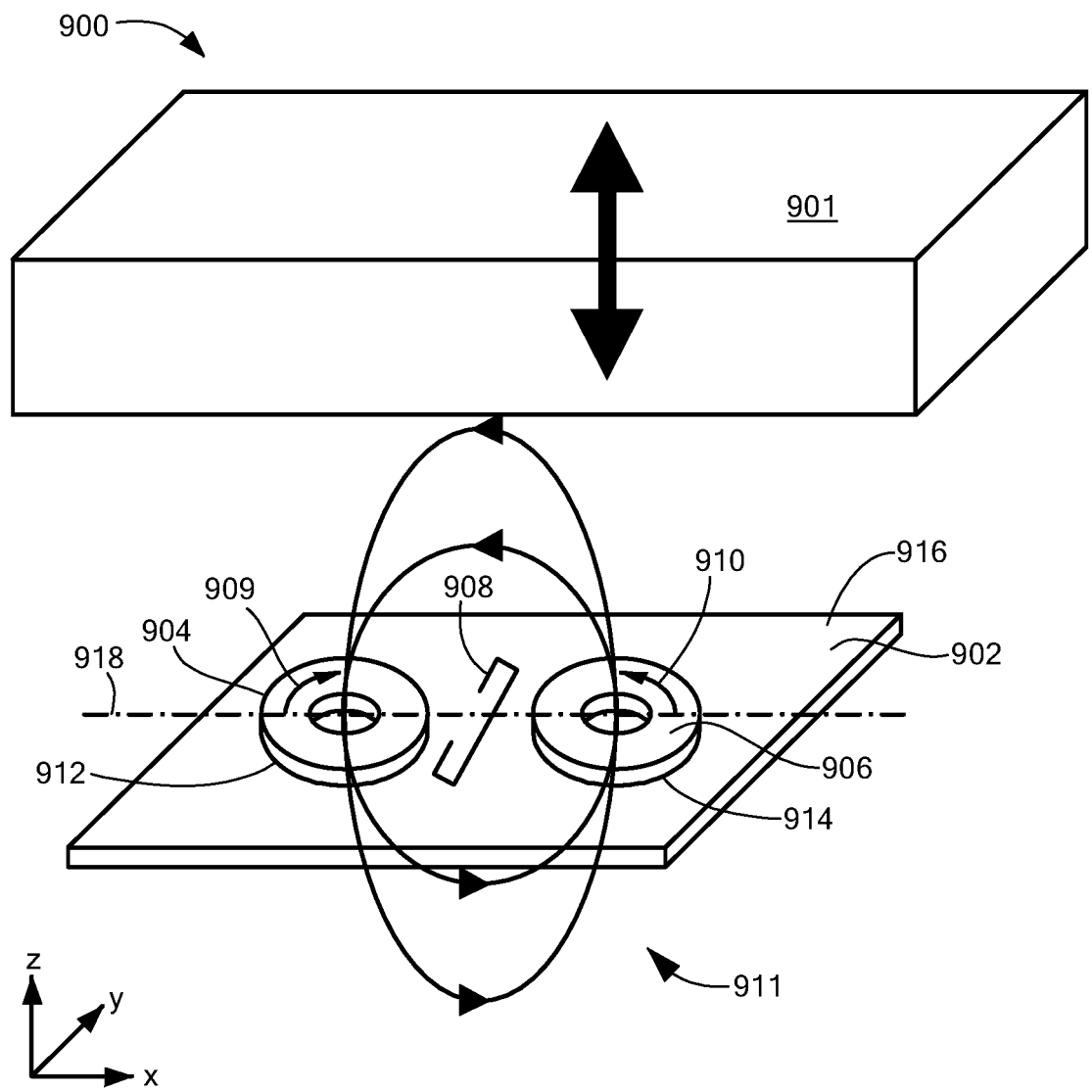
FIG. 9 is a perspective view of a system for a sensor having adjustable sensing element resistance.

FIG. 9 below shows an example system 900 sensor having TMR sensing elements with adjustable resistance for detecting a conductive target 901. System 900 may include a substrate 902, which may support coil 904, coil 906, and MR element 908. Although one MR element is shown, MR element 908 may comprise two or more MR elements depending on the embodiment of system 900. As described above, the resistance of the MR elements can be adjusted. Target 901 may comprise a conductive material, such as a metal, that allows the magnetic fields produced by coils 904 and 906 to induce eddy currents in target 901. Although not shown, an MR driver circuit may provide current to MR element 908 and coil driver circuit 910 may provide current to coils 904 and 906.

Coil 904 and 906 may be arranged so that the current flows through coils 904 and 906 in opposite directions, as shown by arrow 909 (indicating a clockwise current in coil 904) and arrow 910 (indicating a counterclockwise current in coil 906). As a result, coil 904 may produce a magnetic field having a magnetic moment in the negative Z direction (i.e. down, in FIG. 9), as indicated by arrow 912. Similarly, coil 906 may produce a magnetic field having a magnetic moment in the opposite direction, the positive Z direction, as indicated by arrow 914. An aggregate magnetic field 911 produced by both coils may have a shape similar to that shown by magnetic field lines 911. It will be appreciated that coils 904, 906 may be formed by a single coil structure respectively wound so that the current through the coils flows in opposite directions. Alternatively, coils 904, 906 may be formed by separate coil structures.

In an embodiment, MR element 908 may be positioned between coils 904 and 906. In this arrangement, absent any other magnetic fields aside from those produced by coils 904 and 906, the net magnetic field at MR element 908 may be zero. For example, the negative Z component of the magnetic field produced by coil 904 may be canceled out by the positive Z component of the magnetic field produced by coil 906, and the negative X component of the magnetic field shown above substrate 902 may be canceled out by the positive X component of the magnetic field shown below substrate 902. In other embodiments, additional coils may be added to substrate 902 and arranged so that the net magnetic field at MR element 908 is substantially nil.

To achieve a substantially zero magnetic field at the location of MR element 908, coil 904 and coil 906 may be placed so that current through the coils flows in circular patterns substantially in the same plane. For example, the current through coil 904 and 906 is flowing in circular patterns through the coils. As shown, those circular patterns are substantially coplanar with each other, and with the top surface 916 of substrate 902.

A coil driver (not shown in FIG. 9) coupled to coil 904 and/or 906 may produce an alternating field. In this arrangement, the magnetic field shown by magnetic field lines 911 may change direction and magnitude over time. However, during these changes, the magnetic field at the location of MR element 908 may remain substantially nil.

In operation, as target 901 moves toward and away from MR element 908 (i.e. in the positive and negative Z direction), magnetic field 911 will cause eddy currents to flow within target 901. These eddy currents will create their own magnetic fields, which will produce a non-zero magnetic field in the plane of the MR element 908, which non-zero magnetic field can be sensed to detect the motion or position of target 901.

Figure 10:
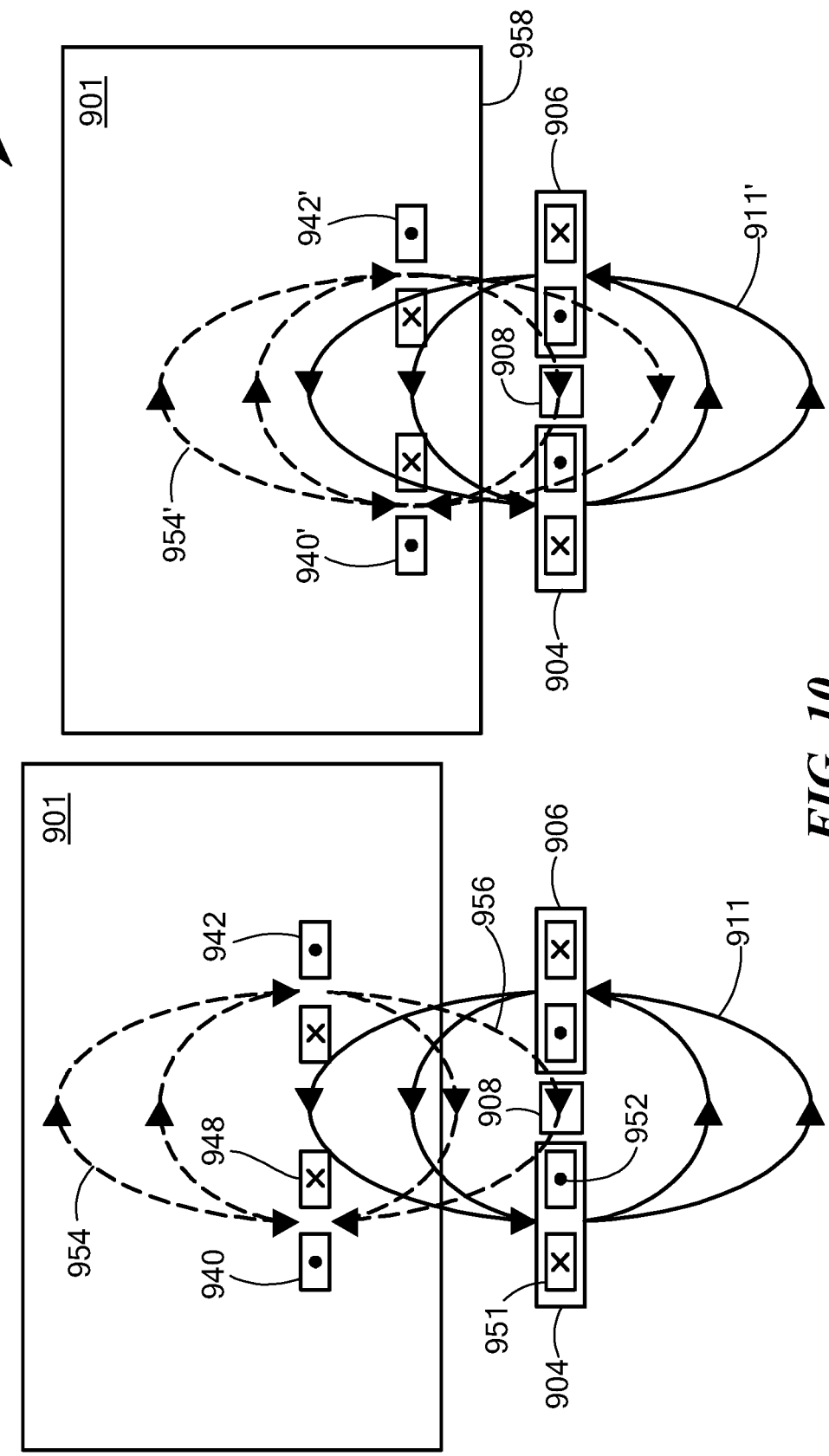
FIG. 10 are cross sectionals view of the system of FIG. 9.

Referring to FIG. 10, a cross-sectional view 950 of system 900, as viewed at line 918 (in FIG. 9) in the Y direction, illustrates the eddy currents within target 901. The 'x' symbol represents a current flowing into the page and the symbol '•' represents a current flowing out of the page. As noted above, the current through coils 904 and 906 may be an alternating current, which may result in an alternating strength of magnetic field 911. In embodiments, the phase of the alternating current through coil 904 matches the phase of the alternating current through coil 906 so that magnetic field 911 is an alternating or periodic field.

Alternating magnetic field 911 may produce eddy currents 940 and 942 within magnetic target 901. Eddy currents 940 and 942 may be opposite in direction to the current flowing through coils 904 and 906, respectively. As shown, eddy current 948 flows out of the page and eddy current 940 flows into the page, while coil current 951 flows into the page and current 952 flows out of the page. Also, as shown, the direction of eddy current 942 is opposite the direction of the current through coil 906.

Eddy currents 940 and 942 generate a reflected magnetic field 954 that has a direction opposite to magnetic field 911.

As noted above, MR element 908 detects a net magnetic field of zero due to magnetic field 911. However, MR element 908 will detect a non-zero magnetic field in the presence of reflected magnetic field 954. As illustrated by magnetic field line 956, the value of reflected magnetic field 954 is non-zero at MR element 908.

As target 901 moves closer to coils 904 and 906, magnetic field 911 may produce stronger eddy currents in target 901. As a result, the strength of reflected magnetic field 954 may change. Magnetic field 911' (in the right-hand panel of FIG. 10) may represent a stronger magnetic field than magnetic field 911 due, for example, to the closer proximity of target 901 to coils 904 and 906. Thus, eddy currents 940' and 942' may be stronger currents than eddy currents 940 and 942, and magnetic field 954' may be stronger than magnetic field 954. This phenomenon may result in MR element 908 detecting a stronger magnetic field (i.e. magnetic field 954') when target 901 is closer to coils 904 and 906, and a weaker magnetic field (i.e. magnetic field 954) when target 901 is further away from coils 904 and 906.

Also, eddy currents 940' and 942' generally occur on or near the surface of target 901. Magnetic field strength diminishes as a function of radius—i.e. as a function of distance from the source of the magnetic field. Therefore, as target 901 moves closer to MR element 908, MR element 908 may experience a stronger magnetic field from the eddy currents because the source of the magnetic field is closer to MR element 908.

Figure 11:
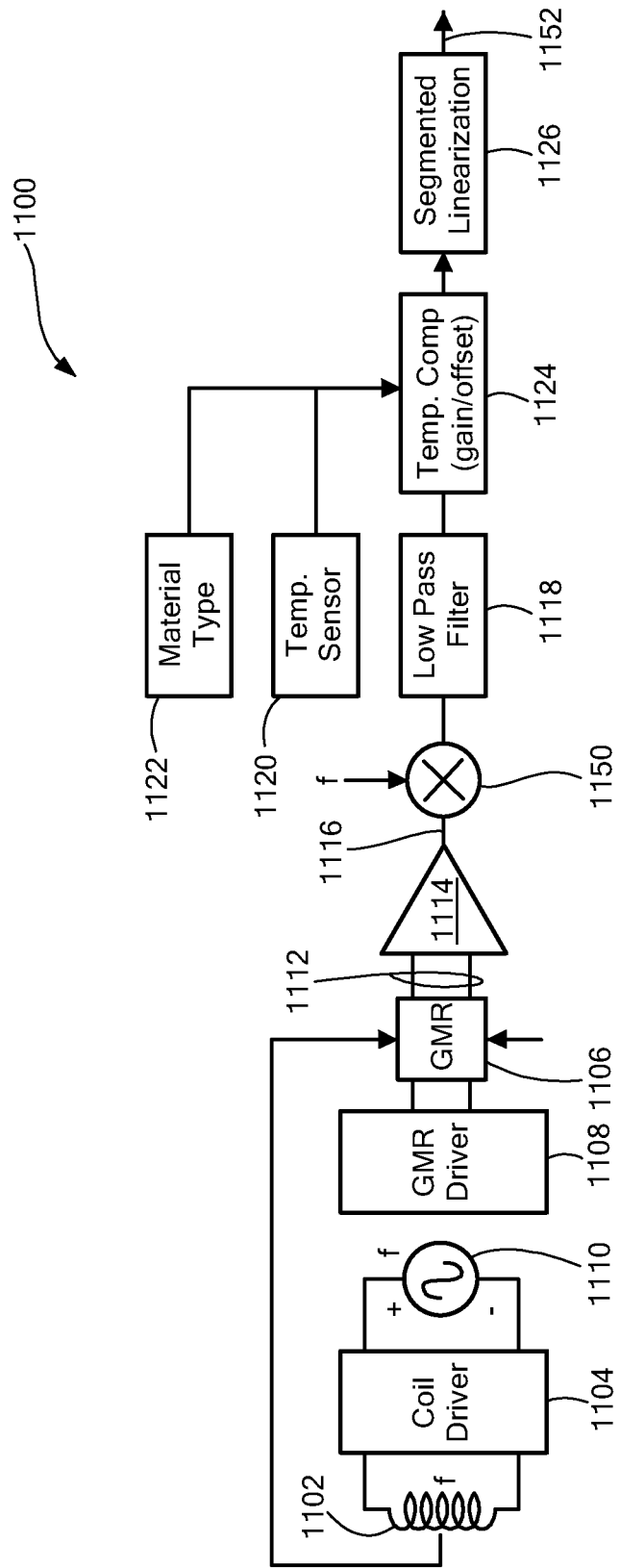
FIG. 11 is a block diagram of a system for a sensor having adjustable sensing element resistance.

FIG. 11 is a block diagram of a magnetic field sensor 1100, which may include coil 1102, coil driver 1104, AC driver 1110, MR driver 1108, MR element 1106, amplifier 1114, low pass filter 1118, temperature sensor 1120, material type module 1122, offset module 1124, and segmented linearization module 1126. As described above, MR element 1106 can comprise a bridge having TMR elements with adjustable resistances.

Coil driver 1104 may provide a power signal that drives current through coil 1102, thus causing coil 1102 to generate a magnetic field. MR driver 1108 may provide power to MR elements 1106, allowing them to detect magnetic fields.

MR element 1106 may be responsive to a sensing element drive signal (e.g. the signal produced by MR driver 1108) and may be configured to detect a directly-coupled magnetic field generated by coil 1102. MR element 1106 may produce signal 1112, representing the detected magnetic field. MR element 1106 may also be configured to detect a reflected magnetic field produced by eddy currents within a target, such as target 101.

As shown, AC driver 1110 is coupled to coil driver 1104. In this embodiment, coil driver 1104 may produce a low-frequency signal to drive coil 1102. The frequency may be low enough so that the magnetic field produced by coil 1102 does not induce eddy currents and a reflected field from target. In some embodiments, the frequency is zero (i.e. a "DC" frequency).

Coil 1102 may produce a DC (or substantially low frequency AC) magnetic field that can be detected by MR element 1106, but which does not produce eddy currents in the target. The signal produced by detection of the DC (or substantially low frequency AC) magnetic field may be used to adjust sensitivity of the magnetic field sensor.

Coil 1102 may also produce an AC magnetic field at higher frequencies that induces eddy currents in the target, which produce a reflected magnetic field at those higher frequencies that can be detected by MR element 1106. Coil 1102 may alternate between producing the low frequency magnetic field and the high frequency magnetic field.

MR element 1106 may produce signal 1112, which may include frequency components at DC or substantially low AC frequency (e.g. a "directly coupled" signal or signal component) representing the lower frequency magnetic field that does not cause eddy currents in the target, and/or frequency components at the higher AC frequency (e.g. a "reflected" signal or signal component) that represent the detected reflected field. In embodiments, the directly coupled signals may be used to adjust sensitivity of the sensor while the reflected signals may be used to detect the target. Coil driver 1104 and/or MR driver 1108 may use the directly coupled signals as a sensitivity signal adjust their respective output drive signals in response to the sensitivity signal.

In embodiments, the directly coupled signal and the reflected signal may be included as frequency components of the same signal. In this case, coil 1102 may be driven to produce both frequency components at the same time. In other embodiments, generation of the directly coupled signal and the reflected signals may be generated at different times, for example using a time-division multiplexing scheme.

Sensor 1100 may also include a demodulator circuit 1150 that can modulate signal 1116 to remove the AC component from the signal or shift the AC component within the signal to a different frequency. For example, demodulator circuit 1150 may modulate signal 1116 at frequency f As known in the art, because signal 1116 includes signal components at frequency f representing the detected magnetic field, modulating signal 1116 at frequency f may shift the signal elements representing the detected magnetic field to 0 Hz or DC. Other frequency components within signal 1116 may be shifted to higher frequencies so they can be removed by low-pass filter 1118. In embodiments, the DC or low frequency component of signal 1116, which may represent a sensitivity value, can be fed back to coil driver 1104 to adjust the output of coil 1102 in response to the signal, and/or to MR driver 1108 to adjust drive signal 1109 in response to the sensitivity value. DC output signal 1152 may represent proximity of the target to MR element 1106.

As used herein, the term "magnetic field signal" is used to describe any signal that results from a magnetic field experienced by a magnetic field sensing element. As used herein, the term "magnetic field sensor" or simply "sensor" is used to describe a circuit that uses one or more magnetic field sensing elements, generally in combination with other circuits. The magnetic field sensor can be, for example, a rotation detector, a movement detector, a current sensor, or a proximity detector. A rotation detector can sense rotation of an object, for example, advance and retreat of magnetic domains of a ring magnet or advance and retreat of gear teeth of a ferromagnetic gear. The term "movement detector" can be used to describe either a rotation detector or a magnetic field sensor that can sense different movement, e.g., linear movement, of a ferromagnetic object, for example, linear movement of magnetic domains of a ring magnet or linear movement of gear teeth of a ferromagnetic gear.

Magnetic field sensors are used in a variety of applications, including, but not limited to an angle sensor that senses an angle of a direction of a magnetic field, a current sensor that senses a magnetic field generated by a current carried by a current-carrying conductor, a magnetic switch that senses the proximity of a ferromagnetic object, a rotation detector (or movement detector) that senses passing ferromagnetic articles, for example, magnetic domains of a ring magnet or a ferromagnetic target (e.g., gear teeth) where the magnetic field sensor is used in combination with a back-bias or other magnet, and a magnetic field sensor that senses a magnetic field density of a magnetic field. The circuits and techniques described herein apply to any magnetic field sensor capable of detecting a magnetic field.

As used herein, the terms "processor" and "controller" are used to describe electronic circuitry that performs a function, an operation, or a sequence of operations. The function, operation, or sequence of operations can be hard coded into the electronic circuit or soft coded by way of instructions held in a memory device. The function, operation, or sequence of operations can be performed using digital values or using analog signals. In some embodiments, the processor or controller can be embodied in an application specific integrated circuit (ASIC), which can be an analog ASIC or a digital ASIC, in a microprocessor with associated program memory and/or in a discrete electronic circuit, which can be analog or digital. A processor or controller can contain internal processors or modules that perform portions of the function, operation, or sequence of operations. Similarly, a module can contain internal processors or internal modules that perform portions of the function, operation, or sequence of operations of the module.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures but should be understood.

It should be understood that a so-called "comparator" can be comprised of an analog comparator having a two-state output signal indicative of an input signal being above or below a threshold level (or indicative of one input signal being above or below another input signal). However, the comparator can also be comprised of a digital circuit having an output signal with at least two states indicative of an input signal being above or below a threshold level (or indicative of one input signal being above or below another input signal), respectively, or a digital value above or below a digital threshold value (or another digital value), respectively.

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A sensor, comprising:
a first magnetic field sensing element comprising a bridge having first, second, third, and fourth legs, wherein the first magnetic field sensing element is configured to provide a differential output signal, wherein the first leg of the bridge comprises a first set of pillars provided as tunneling magnetoresistance (TMR) elements, the second leg of the bridge comprises a second set of pillars provided as TMR elements, the third leg of the bridge comprises a third set of pillars provided as TMR elements, and, the fourth leg of the bridge comprises a fourth set of pillars provided as TMR elements, and
a first switch matrix including a first switch coupled to a first one of the pillars in the first set of pillars to adjust a total resistance of the first leg of the bridge.

2. The sensor according to claim 1, wherein the first switch includes a closed and an open position.

3. The sensor according to claim 1, further including a second switch matrix including a second switch coupled to a first one of the pillars in the second set of pillars to adjust a total resistance of the second leg of the bridge.

4. The sensor according to claim 1, wherein the first and second switch matrices are configured to equalize respective resistance of the first and second sets of pillars.

5. The sensor according to claim 1, further including a second switch matrix including a second switch coupled to a first one of the pillars in the second set of pillars to adjust a total resistance of the second leg, a third switch matrix including a third switch coupled to a first one of the pillars in the third set of pillars to adjust a total resistance of the third leg, and a fourth switch matrix including a fourth switch coupled to a first one of the pillars in the fourth set of pillars to adjust a total resistance of the fourth leg.

6. The sensor according to claim 5, wherein the first, second, third, and fourth switch matrixes are configured to equalize respective resistance of the first, second, third, and fourth legs of the bridge.

7. The sensor according to claim 5, wherein each of the first, second, third, and fourth switch matrixes includes respective switches coupled to more than one pillar in the respective first, second, third, and fourth sets of pillars.

8. The sensor according to claim 7, wherein at least two of the pillars in the first set of pillars that are coupled to switches in the first switch matrix are configured to have different resistances.

9. The sensor according to claim 8, wherein the first switch matrix provides a coarse and fine resistance adjustment for the first set of pillars using the different resistances.

10. A method, comprising:
employing a first magnetic field sensing element comprising a bridge having first, second, third, and fourth legs, wherein the first magnetic field sensing element is configured to provide a differential output signal, wherein the first leg of the bridge comprises a first set of pillars provided as tunneling magnetoresistance (TMR) elements, the second leg of the bridge comprises a second set of pillars provided as TMR elements, the third leg of the bridge comprises a third set of pillars provided as TMR elements, and, the fourth leg of the bridge comprises a fourth set of pillars provided as TMR elements, and
coupling a first switch matrix, which includes a first switch coupled to a first one of the pillars in the first set of pillars, to adjust a total resistance of the first leg of the bridge.

11. The method according to claim 10, wherein the first switch includes a closed and an open position.

12. The method according to claim 10, further including employing a second switch matrix including a second switch coupled to a first one of the pillars in the second set of pillars to adjust a total resistance of the second leg of the bridge.

13. The method according to claim 10, wherein the first and second switch matrices are configured to equalize respective resistance of the first and second sets of pillars.

14. The method according to claim 10, further including employing a second switch matrix including a second switch coupled to a first one of the pillars in the second set of pillars to adjust a total resistance of the second leg, a third switch matrix including a third switch coupled to a first one of the pillars in the third set of pillars to adjust a total resistance of the third leg, and a fourth switch matrix including a fourth switch coupled to a first one of the pillars in the fourth set of pillars to adjust a total resistance of the fourth leg.

15. The method according to claim 14, wherein the first, second, third, and fourth switch matrixes are configured to equalize respective resistance of the first, second, third, and fourth legs of the bridge.

16. The method according to claim 14, wherein each of the first, second, third, and fourth switch matrixes includes respective switches coupled to more than one pillar in the respective first, second, third, and fourth sets of pillars.

17. The method according to claim 16, wherein at least two of the pillars in the first set of pillars that are coupled to switches in the first switch matrix are configured to have different resistances.

18. The method according to claim 17, wherein the first switch matrix provides a coarse and fine resistance adjustment for the first set of pillars using the different resistances.

19. A sensor, comprising:
- a first magnetic field sensing element means for sensing magnetic fields comprising a bridge having first, second, third, and fourth legs, wherein the first leg of the bridge comprises a first set of pillars provided as tunneling magnetoresistance (TMR) elements, the second leg of the bridge comprises a second set of pillars provided as TMR elements, the third leg of the bridge comprises a third set of pillars provided as TMR elements, and, the fourth leg of the bridge comprises a fourth set of pillars provided as TMR elements, and
- a first switch matrix means for adjusting a total resistance of the first leg of the bridge.

20. The sensor according to claim 19, further including a second switch matrix means including a second switch coupled to a first one of the pillars in the second set of pillars for adjusting a total resistance of the second leg of the bridge.

21. The sensor according to claim 19, wherein the first and second switch matrix means are configured for equalizing respective resistance of the first and second sets of pillars.

22. The sensor according to claim 19, further including a second switch matrix means including a second switch coupled to a first one of the pillars in the second set of pillars to adjust a total resistance of the second leg, a third switch matrix means including a third switch coupled to a first one of the pillars in the third set of pillars to adjust a total resistance of the third leg, and a fourth switch matrix means including a fourth switch coupled to a first one of the pillars in the fourth set of pillars to adjust a total resistance of the fourth leg.

23. The sensor according to claim 22, wherein the first, second, third, and fourth switch matrix means are configured for equalizing respective resistance of the first, second, third, and fourth legs of the bridge.

24. The sensor according to claim 22, wherein each of the first, second, third, and fourth switch matrix means includes respective switches coupled to more than one pillar in the respective first, second, third, and fourth sets of pillars.

25. The sensor according to claim 24, wherein at least two of the pillars in the first set of pillars that are coupled to switches in the first switch matrix means are configured to have different resistances.

26. The sensor according to claim 25, wherein the first switch matrix means provides a coarse and fine resistance adjustment for the first set of pillars using the different resistances.

* * * * *